(12) United States Patent
Chae et al.

(10) Patent No.: US 9,520,546 B2
(45) Date of Patent: Dec. 13, 2016

(54) LIGHT-EMITTING DIODE MODULE HAVING LIGHT-EMITTING DIODE JOINED THROUGH SOLDER PASTE AND LIGHT-EMITTING DIODE

(71) Applicant: Seoul Viosys Co., Ltd., Ansan-si (KR)

(72) Inventors: Jong Hyeon Chae, Ansan-si (KR); Joon Sup Lee, Ansan-si (KR); Daewoong Suh, Ansan-si (KR); Won Young Roh, Ansan-si (KR); Min Woo Kang, Ansan-si (KR); Jong Min Jang, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 15/186,358

(22) Filed: Jun. 17, 2016

(65) Prior Publication Data

US 2016/0293818 A1    Oct. 6, 2016

Related U.S. Application Data

(63) Continuation of application No. 14/848,250, filed on Sep. 8, 2015, which is a continuation of application No. PCT/KR2014/003705, filed on Apr. 28, 2014.

(30) Foreign Application Priority Data

May 1, 2013  (KR) .......................... 10-2013-0049053
Aug. 27, 2013 (KR) .......................... 10-2013-0101736
Dec. 6, 2013  (KR) .......................... 10-2013-0151438

(51) Int. Cl.
*H01L 33/00*  (2010.01)
*H01L 27/15*  (2006.01)
(Continued)

(52) U.S. Cl.
CPC ............. *H01L 33/62* (2013.01); *H01L 27/156* (2013.01); *H01L 33/0075* (2013.01);
(Continued)

(58) Field of Classification Search
CPC ........ H01L 33/36; H01L 33/382; H01L 33/48; H01L 33/44; H01L 33/501; H01L 33/505; H01L 33/507; H01L 33/24; H01L 33/387; H01L 25/167; H05K 2201/10106
(Continued)

(56) References Cited

U.S. PATENT DOCUMENTS

2011/0014734 A1   1/2011  Lu
2015/0380621 A1   12/2015 Chae
(Continued)

FOREIGN PATENT DOCUMENTS

JP    2007266396 A    10/2007
KR  1020050052741 A    6/2005
(Continued)

OTHER PUBLICATIONS

PCT International Search Report and Written Opinion of the International Searching Authority for PCT/KR2014/003705 filed Apr. 28, 2014, mailed Aug. 8, 2014, 9 pages.

*Primary Examiner* — Hsien Ming Lee
(74) *Attorney, Agent, or Firm* — Perkins Coie LLP

(57) ABSTRACT

Disclosed are a light emitting diode and a light emitting diode module. The light emitting diode module includes a printed circuit board and a light emitting diode joined thereto through a solder paste. The light emitting diode includes a first electrode pad electrically connected to a first conductive type semiconductor layer and a second electrode pad connected to a second conductive type semiconductor layer, wherein each of the first electrode pad and the second electrode pad includes at least five pairs of Ti/Ni layers or at (Continued)

least five pairs of Ti/Cr layers and the uppermost layer of Au. Thus a metal element such as Sn in the solder paste is prevented from diffusion so as to provide a reliable light emitting diode module.

20 Claims, 17 Drawing Sheets

(51) Int. Cl.
    *H01L 29/22*     (2006.01)
    *H01L 21/00*     (2006.01)
    *H01L 33/62*     (2010.01)
    *H01L 33/14*     (2010.01)
    *H01L 33/38*     (2010.01)
    *H01L 33/40*     (2010.01)
    *H01L 33/44*     (2010.01)
    *H01L 33/50*     (2010.01)

(52) U.S. Cl.
    CPC .............. *H01L 33/14* (2013.01); *H01L 33/38* (2013.01); *H01L 33/405* (2013.01); *H01L 33/44* (2013.01); *H01L 33/505* (2013.01); *H01L 2933/0016* (2013.01); *H01L 2933/0025* (2013.01)

(58) Field of Classification Search
    USPC ........ 438/22–29, 34, 38, 39, 48, 51; 257/13, 257/79–82, 84, 86, 99, 100
    See application file for complete search history.

(56) References Cited

U.S. PATENT DOCUMENTS

2016/0013385 A1    1/2016    Chae
2016/0072011 A1    3/2016    Chae

FOREIGN PATENT DOCUMENTS

| KR | 1020120091839 A | 8/2012 |
|---|---|---|
| KR | 1020130030178 A | 3/2013 |

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

LIGHT-EMITTING DIODE MODULE HAVING LIGHT-EMITTING DIODE JOINED THROUGH SOLDER PASTE AND LIGHT-EMITTING DIODE

CROSS REFERENCE TO RELATED APPLICATION

This patent document is a continuation of U.S. patent application Ser. No. 14/848,250 filed Sep. 8, 2015, which is a continuation of and, claims the benefits of and priority to, a Patent Cooperation Treaty (PCT) Application No. PCT/KR2014/003705, filed on Apr. 28, 2014, which further claims priorities from and the benefits of Korean Patent Application No. 10-2013-0049053, filed on May 1, 2013, Korean Patent Application No. 10-2013-0101736, filed on Aug. 27, 2013, and Korean Patent Application No. 10-2013-0151438, filed on Dec. 6, 2013, which are all hereby incorporated by reference for all purposes as if fully set forth herein.

TECHNICAL FIELD

This patent document relates to a light emitting diode and a light emitting diode module. Some embodiments of this patent document relate to a light emitting diode module including a light emitting diode bonded to a substrate such as a printed circuit board and the like via a solder paste.

BACKGROUND

Since development of gallium nitride (GaN)-based light emitting diodes (LEDs), the GaN-based LEDs are used in various application ranges including natural color LED display devices, LED traffic signboards, white LEDs, and the like.

Generally, a GaN-based LED is formed by growing epitaxial layers on a substrate such as a sapphire substrate, and includes an N-type semiconductor layer, a P-type semiconductor layer and an active layer interposed therebetween. An N-electrode pad is formed on the N-type semiconductor layer and a P-electrode pad is formed on the P-type semiconductor layer. The light emitting diode is electrically connected to an external power source through the electrode pads. In operation, current flows from the P-electrode pad to the N-electrode pad through the semiconductor layers.

SUMMARY

Embodiments of the disclosed technology provide an LED module that includes a light emitting diode bonded to a substrate via solder paste.

Embodiments of the disclosed technology a light emitting diode capable of preventing diffusion of metal elements of solder paste, and an LED module including the same.

Embodiments of the disclosed technology a light emitting diode having improved current spreading performance.

Embodiments of the disclosed technology provide a light emitting diode capable of improving light extraction efficiency through improvement of reflectivity.

Embodiments of the disclosed technology provide a light emitting diode enabling simplification of a fabrication process while improving current spreading performance, an LED module including the same, and a method of fabricating the same.

In one aspect, a light emitting diode module is provided to include a printed circuit board; and the light emitting diode bonded to the printed circuit board. The light emitting diode may comprise a first conductive-type semiconductor layer; a plurality of mesas placed on the first conductive-type semiconductor layer and each including an active layer and a second conductive-type semiconductor layer; a first electrode pad electrically connected to the first conductive-type semiconductor layer; and a second electrode pad electrically connected to the second conductive-type semiconductor layer of each of the mesas, wherein the first electrode pad and the second electrode pad are respectively bonded to corresponding pads on the printed circuit board via solder paste, and each of the first electrode pad and the second electrode pad comprises a solder barrier layer and an oxidation barrier layer.

Since each of the first and second electrode pads includes the solder barrier layer, it is possible to prevent metal elements such as Sn in the solder paste from diffusing into the light emitting diode.

In some implementations, the light emitting diode may further include reflective electrode structures respectively placed on the mesas; and a current spreading layer covering the plurality of mesas and the first conductive-type semiconductor layer, including openings respectively placed in upper regions of the mesas while exposing the reflective electrode structures, wherein the current spreading layer forms ohmic contact with the first conductive-type semiconductor layer and is insulated from the plurality of mesas, wherein the first electrode pad is electrically connected to the current spreading layer and the second electrode pad is electrically connected to the reflective electrode structures.

Since the current spreading layer covers the plurality of mesas and the first conductive-type semiconductor layer, the light emitting diode has improved current spreading performance.

In some implementations, each of the reflective electrode structures may include a reflective metal section; a capping metal section; and an oxidation prevention metal section, the reflective metal section having an inclined side surface such that an upper surface of the reflective metal section has a narrower area than a lower surface thereof, the capping metal section covering the upper and side surfaces of the reflective metal section. Further, the oxidation prevention metal section covers the capping metal section, a stress relief layer being formed at an interface between the reflective metal section and the capping metal section. The stress relief layer relieves stress due to a difference in coefficient of thermal expansion between different metal layers.

In some implementations, the plurality of mesas may have an elongated shape extending in one direction and may be parallel to each other, and the openings of the current spreading layer may be placed to be biased towards the same ends of the plurality of mesas.

In some implementations, the current spreading layer includes a reflective metal. In some implementations, the current spreading layer may have a reflectivity of 65% to 75%. With this structure, it is possible to provide light reflection by the current spreading layer in addition to light reflection by the reflective electrodes, whereby light traveling through sidewalls of the plurality of mesas and the first conductive-type semiconductor layer can be reflected.

In some implementations, the light emitting diode may further include an upper insulation layer covering at least part of the current spreading layer and including openings exposing the reflective electrode structures, wherein the second electrode pad is placed on the upper insulation layer and electrically connected to the reflective electrode structures exposed through the openings of the upper insulation layer.

In some implementations, the light emitting diode may further include an anti-diffusion reinforcing layer placed between the reflective electrode structures and the second electrode pad. In some implementations, the anti-diffusion reinforcing layer can prevent metal elements diffusing through the second electrode pad from entering the light emitting diode. In some implementations, the anti-diffusion reinforcing layer may be formed of the same material as that of the current spreading layer.

In some implementations, the light emitting diode may further include a lower insulation layer placed between the plurality of mesas and the current spreading layer and insulating the current spreading layer from the plurality of mesas, the lower insulation layer including openings respectively placed in the upper regions of the mesas and exposing the reflective electrode structures.

In some implementations, the openings of the current spreading layer may have a greater width than the openings of the lower insulation layer so as to allow all of the openings of the lower insulation layer to be exposed therethrough.

In some implementations, the light emitting diode may further include an upper insulation layer covering at least part of the current spreading layer and including openings exposing the reflective electrode structures, wherein the upper insulation layer may cover sidewalls of the openings of the current spreading layer.

In some implementations, the lower insulation layer may include a silicon oxide layer and the upper insulation layer may include a silicon nitride layer. In some implementations, the upper insulation layer formed of the silicon nitride layer can prevent metal elements of the solder paste from diffusing therethrough.

In some implementations, the light emitting diode may further include a substrate and a wavelength converter covering a lower surface of the substrate. In some implementations, the substrate may be a growth substrate for growing semiconductor layers. Furthermore, the wavelength converter may cover the lower surface and a side surface of the substrate.

In some implementations, the solder barrier layer may include a metal layer including Cr, Ti, Ni, Mo, TiW or W, or a combination of any two of Cr, Ti, Ni, Mo, TiW or W, and the oxidation barrier layer includes an Au, Ag or organic material layer.

In some implementations, the solder paste may cover at least part of a side surface of each of the first electrode pad and the second electrode pad.

In some implementations, the solder paste may contact a lower surface of the light emitting diode adjacent to the first electrode pad and the second electrode pad. In some implementations, the light emitting diode may further include an upper insulation layer placed on the lower surface thereof, and the solder paste may contact the upper insulation layer. In some implementations, the solder paste may partially cover a side surface of the light emitting diode.

In some implementations, the solder paste may contain Sn and other metals, and Sn may be present in an amount of 50 wt % or more based on the total weight of the solder paste. In some implementations, Sn may be present in an amount of 60 wt % or more, for example, 90 wt % or more, based on the total weight of the solder paste.

In some implementations, the light emitting diode further comprises: reflective electrode structures placed over the mesas; and a current spreading layer covering the plurality of mesas and the first conductive-type semiconductor layer, wherein the current spreading layer is disposed to form openings exposing at least a portion of the reflective electrode structures and the current spreading layer forms ohmic contact with the first conductive-type semiconductor layer and is insulated from the plurality of mesas, wherein the first electrode pad is electrically connected to the current spreading layer and the second electrode pad is electrically connected to the reflective electrode structures. In some implementations, the light emitting diode further comprises an upper insulation layer covering at least part of the current spreading layer, the upper insulation layer is disposed to form openings exposing at least portions of the reflective electrode structures, and the second electrode pad is placed over the upper insulation layer and electrically connected to the exposed portions of the reflective electrode structures.

In another aspect, a light emitting diode module is provided to include a printed circuit board; and the light emitting diode bonded to the printed circuit board, wherein the light emitting diode includes: a first conductive-type semiconductor layer; a plurality of mesas placed on the first conductive-type semiconductor layer and each including an active layer and a second conductive-type semiconductor layer; reflective electrode structures respectively placed on the mesas; an anti-diffusion reinforcing layer placed on each of the reflective electrode structures; a first electrode pad electrically connected to the first conductive-type semiconductor layer; and a second electrode pad electrically connected to the anti-diffusion reinforcing layer, wherein the first electrode pad and the second electrode pad are respectively bonded to corresponding pads on the printed circuit board via solder paste.

In some implementations, the light emitting diode may further include a current spreading layer covering the plurality of mesas and the first conductive-type semiconductor layer, including openings respectively placed in upper regions of the mesas and exposing the reflective electrode structures, forming ohmic contact with the first conductive-type semiconductor layer, and insulated from the plurality of mesas. The first electrode pad is electrically connected to the current spreading layer.

In some implementations, the anti-diffusion reinforcing layer may be formed of the same material as that of the current spreading layer. Accordingly, the anti-diffusion reinforcing layer may be formed together with the current spreading layer through the same process.

In some implementations, the current spreading layer may include Cr, Al, Ni, Ti, or Au.

In some implementations, the solder pastes may include Sn—Ag—Cu alloys.

In some implementations, the solder paste may comprise 50 wt % or more of Sn of the total weight of metals.

In some implementations, the solder paste covers upper surfaces and at least a portion of side surfaces of the first electrode pad and the second electrode pad. In some implementations, the solder paste is in contact with a surface of the light emitting diode that is located closer to the first electrode pad and the second electrode pad than the other surface of the light emitting diode.

In another aspect, a light emitting diode is provided to comprise: a first conductive-type semiconductor layer; a plurality of mesas placed over the first conductive-type semiconductor layer, each including an active layer and a second conductive-type semiconductor layer; a first electrode pad electrically connected to the first conductive-type semiconductor layer; and a second electrode pad electrically connected to the second conductive-type semiconductor layer of each of the mesas, wherein each of the first electrode pad and the second electrode pad comprises a solder barrier layer and an oxidation barrier layer.

In some implementations, solder barrier layer includes Cr, Ti, Ni, Mo, TiW or W or a combination of Cr, Ti, Ni, Mo, TiW or W, and the oxidation barrier layer includes an Au, Ag or organic material layer. In some implementations, the light emitting diode module further comprises: a substrate; a wavelength converter covering one surface of the substrate, wherein the first conductive-type semiconductor layer is formed over the other surface of the substrate.

In one aspect, a light emitting diode is provided to comprise: a first conductive-type semiconductor layer; a plurality of mesas placed over the first conductive-type semiconductor layer, each including an active layer and a second conductive-type semiconductor layer; reflective electrode structures placed over the mesas; an anti-diffusion reinforcing layer placed over each of the reflective electrode structures; a first electrode pad electrically connected to the first conductive-type semiconductor layer; and a second electrode pad electrically connected to the anti-diffusion reinforcing layer.

In some implementations, at least one of the plurality of mesas extends in a direction to adjoin to an edge of the first conductive-type semiconductor layer. In some implementations, the light emitting diode module further comprises: a current spreading layer formed over the plurality of mesas and the first conductive-type semiconductor layer and spaced apart from the anti-diffusion layer.

In another aspect, a method of fabricating a light emitting diode includes: forming a first conductive-type semiconductor layer, an active layer and a second conductive-type semiconductor layer on a substrate; forming a plurality of mesas on the first conductive-type semiconductor layer by patterning the second conductive-type semiconductor layer and the active layer; forming reflective electrode structures on the plurality of mesas to form ohmic contact with the plurality of mesas, respectively; forming a current spreading layer that covers the plurality of mesas and the first conductive-type semiconductor layer, includes openings respectively placed in upper regions of the mesas and exposing the reflective electrode structures, forms ohmic contact with the first conductive-type semiconductor layer and is insulated from the plurality of mesas; and forming a first electrode pad electrically connected to the current spreading layer and a second electrode pad electrically connected to the reflective electrode structures, wherein each of the first electrode pad and the second electrode pad may include a solder barrier layer and an oxidation barrier layer.

In some implementations, the method may further include forming an anti-diffusion reinforcing layer on the reflective electrode structure, wherein the anti-diffusion reinforcing layer may be formed together with the current spreading layer, and the second electrode pad may be connected to the anti-diffusion reinforcing layer.

In some implementations, The method may further include, before forming the current spreading layer, forming a lower insulation layer that covers the plurality of mesas and the first conductive-type semiconductor layer, and includes openings exposing the first conductive-type semiconductor layer and openings respectively placed in upper regions of the mesas and exposing the reflective electrode structures.

In some implementations, the method may further include forming an upper insulation layer on the current spreading layer, the upper insulation layer including openings exposing the reflective electrode structures and may cover sidewalls of the openings of the current spreading layer.

In some implementations, the lower insulation layer may include a silicon oxide layer and the upper insulation layer may include a silicon nitride layer.

In some implementations, the method further comprise: before the forming of the plurality of mesas, forming the reflective electrode structures over the second conductive-type semiconductor layer.

After the first electrode pad and the second electrode pad are formed, the substrate may be partially removed to become thin through grinding and/or lapping. Thereafter, the substrate is divided to provide individual LED chips isolated from each other. Next, a wavelength converter may be coated onto the LED chips, and the LED chip having the wavelength converter is mounted on a printed circuit board via solder paste, thereby providing an LED module.

The wavelength converter may be formed by coating a phosphor-containing resin onto the LED chip, followed by curing, or may be formed by spraying phosphor powder onto the LED chip via an aerosol sprayer.

Embodiments of the disclosed technology provide a light emitting diode capable of preventing diffusion of metal elements of solder paste, and an LED module including the same. In addition, embodiments of the disclosed technology provide a light emitting diode having improved current spreading performance, for example, a flip-chip type light emitting diode. Further, embodiments of the disclosed technology provide a light emitting diode that has improved reflectivity using a current spreading layer and thus has improved light extraction efficiency. Furthermore, the light emitting diode according to the embodiments of the disclosed technology has a simple mesa structure, thereby enabling simplification of an LED fabrication process. On the other hand, solder paste may cover upper surfaces of electrode pads of a flip-chip type light emitting diode while covering at least part of side surfaces thereof. Furthermore, the solder paste may contact a lower surface of the light emitting diode adjacent the electrode pads, whereby heat generated in the light emitting diode can be discharged through the solder pastes. Further, the solder paste may cover at least part of the side surface of the light emitting diode to reflect light emitted through the side surface of the light emitting diode, thereby improving luminous efficacy.

DETAILED DESCRIPTION

Figure 1:
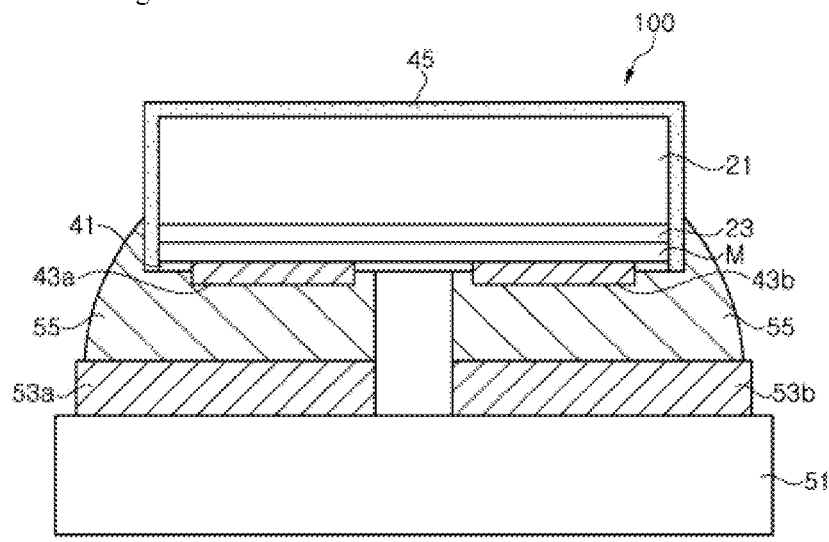
FIG. 1 is a schematic side sectional view of a light emitting diode module according to one embodiment of the disclosed technology.

A flip chip type light emitting diode is used to prevent light loss by the P-electrode pad while improving heat dissipation efficiency, and a variety of electrode structures have been suggested to help current spreading in a large flip chip type light emitting diode (for example, U.S. Pat. No. 6,486,499). For example, a reflective electrode is formed on the P-type semiconductor layer, and extensions for current spreading are formed on an exposed region of the N-type semiconductor layer formed by etching the P-type semiconductor layer and the active layer.

The reflective electrode formed on the P-type semiconductor layer reflects light generated in the active layer to improve light extraction efficiency while facilitating current spreading in the P-type semiconductor layer. On the other hand, the extensions connected to the N-type semiconductor layer help current spreading in the N-type semiconductor layer to allow uniform generation of light over a wide active area.

A light emitting diode having a large area of about 1 mm2 or more used for high power requires current spreading not only in the P-type semiconductor layer but also in the N-type semiconductor layer. However, a conventional technique employs linear extensions having high resistance and thus has a limit in current spreading. Moreover, since the reflective electrode is restrictively placed on the P-type semiconductor layer, a significant amount of light is absorbed into the pads and the extensions instead of being reflected by the reflective electrode, thereby causing significant light loss.

In a final product, the light emitting diode is provided in the form of an LED module. In general, the LED module includes a printed circuit board and an LED package mounted on the printed circuit board, in which the light emitting diode is mounted in chip form within the LED package. A conventional LED chip is mounted on a submount, a lead frame or a lead electrode via silver paste or AuSn solder and packaged to form an LED package, which in turn is mounted on a printed circuit board or the like via the solder paste. Accordingly, the pads on the LED chip are placed apart from the solder paste, and bonded by a relatively stable bonding material such as silver paste or AuSn solder.

Recently, studies have been made to develop a technology for fabricating an LED module by directly bonding pads of a light emitting diode to a printed circuit board via solder paste. For example, an LED module is fabricated by directly mounting an LED chip on a PCB instead of packaging the LED chip, or by fabricating a so-called wafer level LED package, followed by mounting the LED package on a printed circuit board. Since the pads directly adjoin the solder paste in these LED modules, metal elements such as tin (Sn) in the solder paste diffuse into the light emitting diode through the pads and can generate short circuit in the light emitting diode, thereby causing device failure.

Hereinafter, various implementations of the disclosed technology will be described in more detail with reference to the accompanying drawings. It should be understood that the following embodiments are given by way of illustration only to facilitate the understanding of some implementations of the disclosed technology. Therefore, the disclosed technology is not limited to the following embodiments and may be embodied in different ways. Further, the widths, lengths, and thicknesses of certain elements, layers or features may be exaggerated for clarity, and like components will be denoted by like reference numerals throughout the accompanying drawings.

FIG. 1 is a schematic side sectional view of a light emitting diode module according to one embodiment of the disclosed technology.

Referring to FIG. 1, an LED module includes a printed circuit board 51 having pads 53a and 53b and an light emitting diode 100 bonded to the printed circuit board 51 via solder pastes 55. The light emitting diode 100 includes a first conductive-type semiconductor layer 23, a mesa M, a first electrode pad 43a, and a second electrode pad 43b. In some implementations, the light emitting diode 100 may include an upper insulation layer 41 on a lower surface thereof. The mesa M includes an active layer (not shown) and a second conductive-type semiconductor layer (not shown). In some implementations, the light emitting diode may include a substrate 21 and a wavelength converter 45.

The printed circuit board is or includes a substrate having a printed circuit formed thereon and may include any substrate capable of providing an LED module.

In the related art, an LED chip is mounted on a printed circuit board having a lead frame or lead electrodes thereon, and packaged to provide an LED package, which in turn is mounted on a printed circuit board. In this embodiment, the first and second electrode pads 43a and 43b formed on the LED chip are directly mounted on the printed circuit board 51 via the solder pastes.

On the printed circuit board, the light emitting diode is placed upside down in a flip-chip structure, and a surface of the substrate 21, for example, a surface of the substrate opposite to the mesa M, is covered with the wavelength converter 45. The wavelength converter 45 may cover not only the lower surface of the substrate 21 but also a side surface of the substrate 21. Here, the substrate 21 may be or include a growth substrate for growing GaN-based semiconductor layers, for example, a patterned sapphire substrate (PSS). Further, a plurality of mesas M may be placed on the first conductive-type semiconductor layer 23 so as to be separated from each other.

The solder pastes 55 serve to bond the first electrode pad 43a and the second electrode pad 43b to the pads 53a and 53b on the printed circuit board. The solder pastes 55 may cover lower surfaces of the first electrode pad 43a and the second electrode pad 43b, and may cover at least part of side surfaces of the first and second electrode pads 43a and 43b, as shown in FIG. 1. Further, the solder pastes 55 may contact the upper insulation layer 41 placed on the lower surface of the light emitting diode 100. The solder pastes 55 directly contact the lower surface of the light emitting diode 100, thereby facilitating heat dissipation from the light emitting diode 100 through the solder pastes 55. Furthermore, the solder pastes 55 may cover part of a side surface of the light emitting diode 100. The solder pastes 55 may cover part of the side surface of the substrate. With this structure, the light emitting diode 100 can reflect light emitted from the side surface thereof using the solder pastes 55, thereby improving efficiency of light emitted from the light emitting diode 100.

For the description of the structure, the term "solder paste" may mean a final bonding layer formed of or including a paste, which is or includes a mixture of metal powder, flux or an organic material. For the description of the method of fabricating an LED module, the term "solder paste" may mean a paste, which is a mixture of metal powder, flux or an organic material.

As a final bonding layer, the solder paste 55 contains Sn and other metals. Sn may be present in an amount of 50 wt % or more of the total weight of metals in the solder paste. In another embodiment, Sn is present in an amount of 60 wt % or more of the total weight of metals in the solder paste. In a further embodiment, Sn is present in an amount of 90 wt % or more of the total weight of metals in the solder paste.

The solder paste 55 may contain or include, for example, Sn/Pb, in amounts of 63 wt %/37 wt %, or may contain Sn/Pb/Ag in amounts of 62 wt %/36 wt %/2 wt %. The solder paste 55 may be a Pb-free alloy. For example, the solder paste 55 may contain Sn/Ag in amounts of 96.5 wt %/3.5 wt %. Further, the solder paste 55 may contain Sn/Ag/Cu in amounts of 96.5 wt %/3 wt %/0.5 wt %, 95.8 wt %/3.5 wt %/0.7 wt %, 95.5 wt %/3.8 wt %/0.7 wt %, 95.5 wt %/3.9 wt %/0.6 wt %, or 95.5 wt %/4.0 wt %/0.5 wt %. In another embodiment, the solder paste 55 may contain Sn and Sb in amounts of 95 wt % and 5 wt %, respectively.

FIG. 1 schematically shows the LED module according to the embodiment for convenience of description, and the structure and components of the light emitting diode will become more apparent by the following description of a method of fabricating a light emitting diode.

FIG. 2 to FIG. 11 are views illustrating a method of fabricating a light emitting diode according to one embodiment of the disclosed technology, in which (a) is a plan view and (b) is a sectional view taken along line A-A in each of FIG. 2 to FIG. 10.

Figure 2:
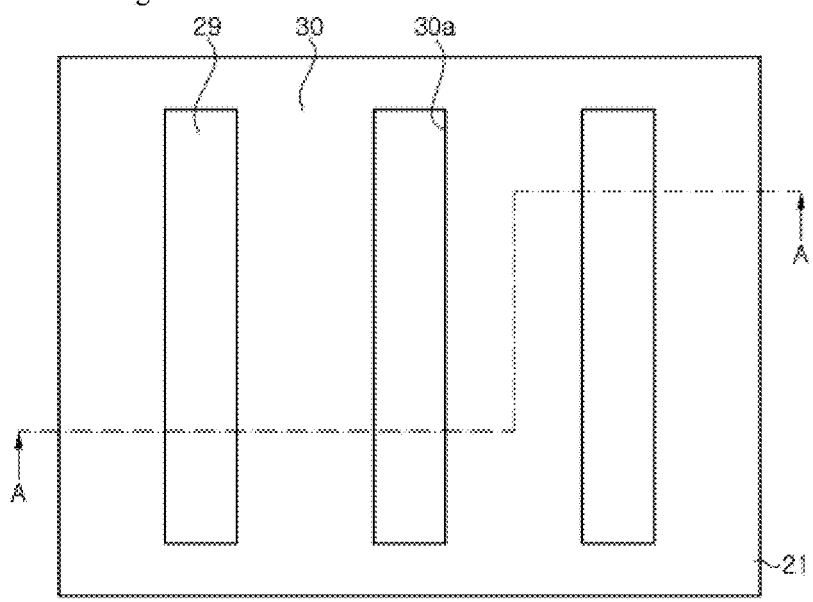
FIG. 2 to FIG. 11 are views illustrating a method of fabricating a light emitting diode according to one embodiment of the disclosed technology, in which (a) is a plan view and (b) is a sectional view taken along line A-A in each of FIG. 2 to FIG. 10.
Figure 2:
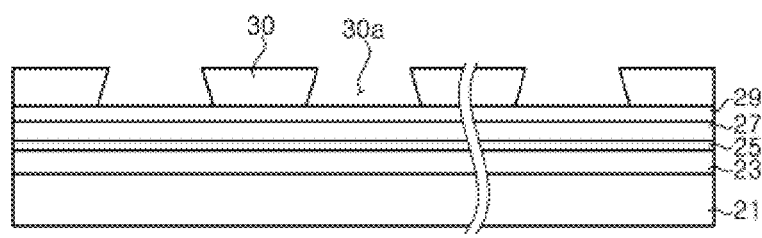

Referring to FIG. 2, a first conductive-type semiconductor layer 23, an active layer 25 and a second conductive-type semiconductor layer 27 are grown on a substrate 21. The substrate 100 is or includes a substrate capable of growing GaN-based semiconductor layers, and may be, for example, a sapphire substrate, a silicon carbide substrate, a gallium nitride (GaN) substrate, a spinel substrate, or the like. In some implementations, the substrate may be a patterned substrate.

The first conductive-type semiconductor layer may include, for example, an n-type GaN-based layer, and the second conductive-type semiconductor layer 27 may include, for example, a p-type GaN-based layer. In addition, the active layer 25 may include a single-quantum well structure or a multi-quantum well structure, and may include a well layer and a barrier layer. The well layer may have compositional elements selected depending upon a desired wavelength of light, and may include, for example, InGaN.

A preliminary insulation layer 29 may be formed on the second conductive-type semiconductor layer 27. The preliminary insulation layer 29 may be formed of or include SiO$_2$ by, for example, chemical vapor deposition.

Then, a photoresist pattern 30 is formed. The photoresist pattern 30 has openings 30a for forming reflective electrode structures. The openings 30a are formed such that a bottom of each opening has a smaller width than an inlet of the openings 30a. A negative type photoresist facilitates formation of the photoresist pattern 30 having the openings 30a with such shape.

Figure 3:
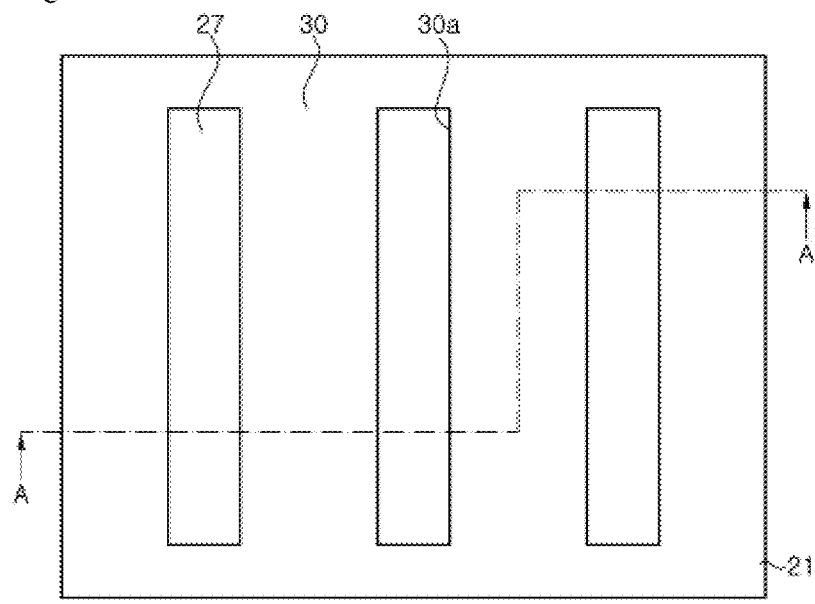
Figure 3:
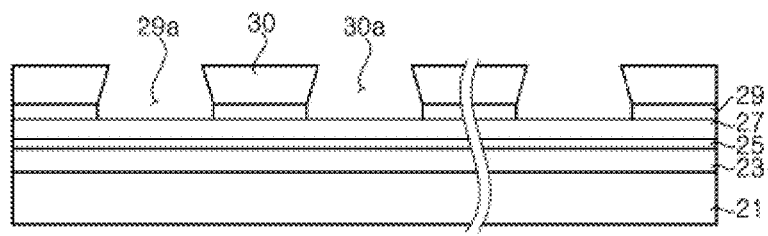

Referring to FIG. 3, the preliminary oxidation layer 29 is etched using the photoresist pattern 30 as an etching mask. The preliminary oxidation layer 29 may be etched by wet etching. Accordingly, the preliminary oxidation layer 29 in the openings 30a of the photoresist pattern 30 is etched to form openings 29a of the preliminary oxidation layer 29, which expose the second conductive-type semiconductor layer 27. The openings 29a generally have a similar or greater area than a bottom area of the openings 30a of the photoresist pattern 30.

Figure 4:
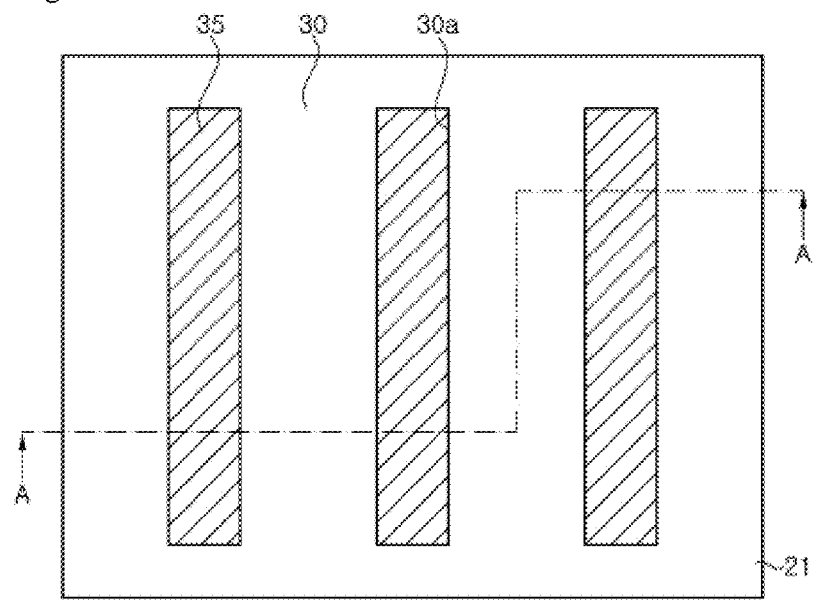
Figure 4:
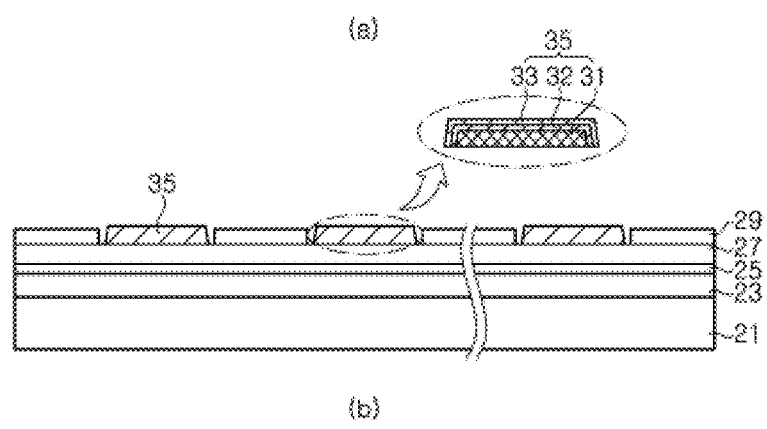

Referring to FIG. 4, reflective electrode structures 35 are formed using lift-off technology. The reflective electrode structure 35 may include a reflective metal section 31, a capping metal section 32, and an oxidation prevention metal section 33. The reflective metal section 31 may include a reflective layer and a stress relief layer may be formed between the reflective metal section 31 and the capping metal section 32. The stress relief layer relieves stress due to a difference in coefficient of thermal expansion between the reflective metal section 31 and the capping metal section 32.

The reflective metal section 31 may be formed of or include, for example, Ni/Ag/Ni/Au, and may have a total thickness of about 1600 Å. As shown, the reflective metal section 31 may have an inclined side surface, that is, a structure in which a bottom surface has a greater area than an upper surface. Such a reflective metal section 31 may be formed by e-beam evaporation.

The capping metal section 32 covers the upper and side surface of the reflective metal section 31 to protect the reflective metal section 31. The capping metal section 32 may be formed by sputtering or by e-beam evaporation (for example, planetary e-beam evaporation) in which the substrate 21 is rotated in a tilted state during vacuum deposition. The capping metal section 32 may include Ni, Pt, Ti, or Cr, and may be formed by depositing, for example, about 5 pairs of Ni/Pt or about 5 pairs of Ni/Ti. Alternatively, the capping metal section 32 may include TiW, W, or Mo.

The stress relief layer may be formed of or include a material selected in various ways depending upon the metallic materials of the reflective layer and the capping metal section 32. For example, when the reflective layer is composed of or includes Al or Al alloys and the capping metal section 32 is composed of or includes W, TiW or Mo, the stress relief layer may be a single layer including Ag, Cu, Ni, Pt, Ti, Rh, Pd or Cr, or a composite layer including Cu, Ni, Pt, Ti, Rh, Pd or Au. Further, when the reflective layer is composed of or includes Al or Al alloys and the capping metal section 32 is composed of or includes Cr, Pt, Rh, Pd or Ni, the stress relief layer may be a single layer including Ag or Cu, or a composite layer including Ni, Au, Cu or Ag.

Further, when the reflective layer is composed of or includes Ag or Ag alloys and the capping metal section 32 is composed of or includes W, TiW or Mo, the stress relief layer may be a single layer including Cu, Ni, Pt, Ti, Rh, Pd or Cr, or a composite layer including Cu, Ni, Pt, Ti, Rh, Pd, Cr or Au. Further, when the reflective layer is composed of or includes Ag or Ag alloys and the capping metal section 32 is composed of or includes Cr or Ni, the stress relief layer may be a single layer including Cu, Cr, Rh, Pd, TiW or Ti, or a composite layer including Ni, Au or Cu.

Further, the oxidation prevention metal section 33 includes Au in order to prevent oxidation of the capping metal section 32, and may be formed of or include, for example, Au/Ni or Au/Ti. Ti exhibits good adhesion to an oxide layer such as SiO$_2$ and thus is preferred. The oxidation prevention metal section 33 may be formed by sputtering or by e-beam evaporation (for example, planetary e-beam evaporation) in which the substrate 21 is rotated in a tilted state during vacuum deposition.

After deposition of the reflective metal structures 35, the photoresist pattern 30 is removed and thus the reflective metal structures 35 remain on the second conductive-type semiconductor layer 27, as shown in FIG. 4.

Figure 5:
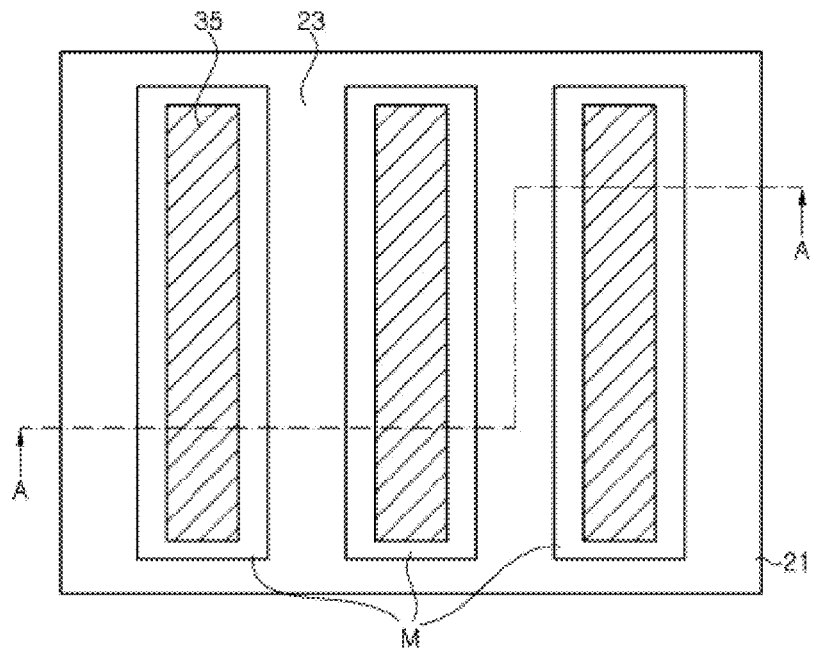
Figure 5:
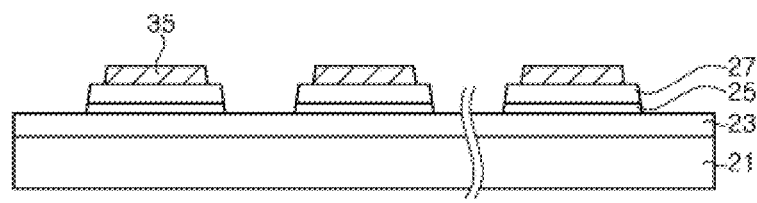

Referring to FIG. 5, a plurality of mesas M separated from each other are formed on the first conductive-type semiconductor layer 21. Each of the plurality of mesas M includes the active layer 25 and the second conductive-type semiconductor layer 27. The active layer 25 is placed between the first conductive-type semiconductor layer 23 and the second conductive-type semiconductor layer 27. On the other hand, the reflective electrode structure 35 is placed on each of the mesas M.

The plural mesas M may be formed by patterning the second conductive-type semiconductor layer 27 and the active layer 25 so as to expose the first conductive-type semiconductor layer 23. The plural mesas M may be formed to have inclined side surfaces using photoresist reflow technology. The inclined profile of the side surface of the mesa M improves extraction efficiency of light generated in the active layer 25.

As shown, the plural mesas M may have an elongated shape and be formed parallel to each other. Such a shape simplifies formation of the plural mesas M having the same shape in a plurality of chip areas on the substrate 21.

The reflective electrode structures 35 cover most region of an upper surface of the mesa M and have substantially the same shape as the shape of the mesas M in a plan view.

In the course of etching the second conductive-type semiconductor layer 27 and the active layer 25, the preliminary oxidation layer 29 remaining thereon is also partially etched and removed. On the other hand, on each of the mesas M, although the preliminary oxidation layer 29 may remain near an edge of the reflective electrode structure 35, the preliminary oxidation layer 29 may be removed by wet etching or the like. Alternatively, the preliminary oxidation layer 29 may be removed before formation of the mesas M.

Figure 6:
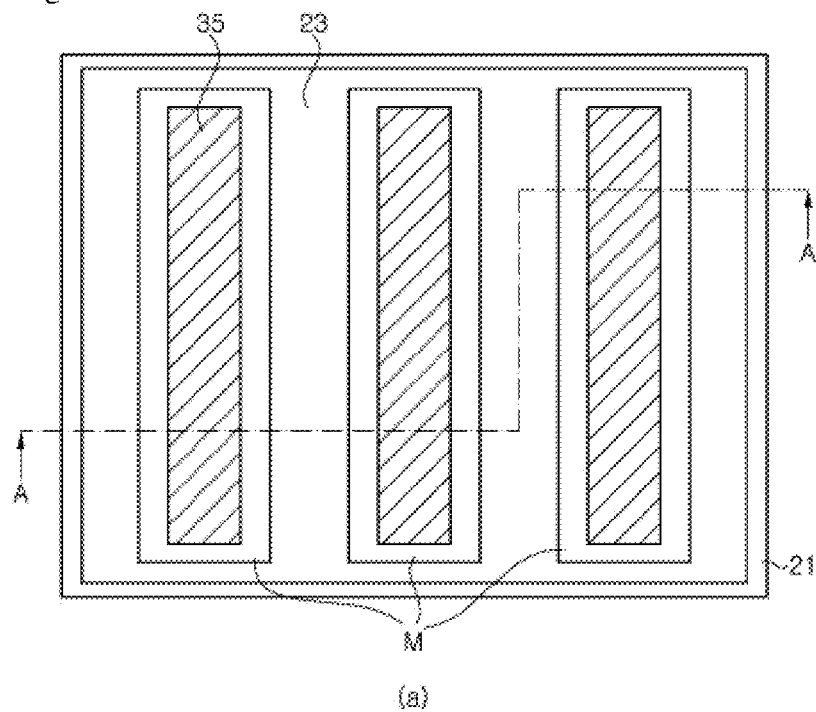
Figure 6:
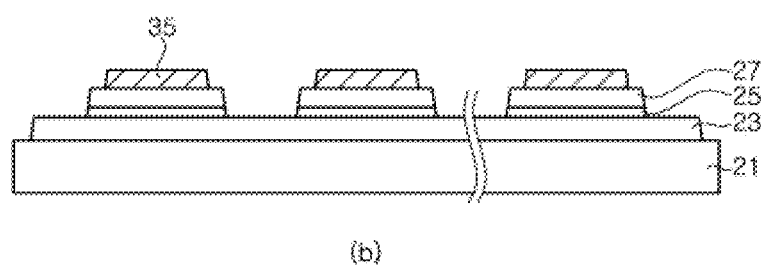

Referring to FIG. 6, after formation of the plural mesas M, the first conductive-type semiconductor layer 23 may be subjected to etching so as to divide LED areas in chip unit. Accordingly, the upper surface of the substrate 21 is exposed near the edge of the first conductive-type semiconductor layer 23.

As shown in FIG. 6, the plurality of mesas M may be placed inside an upper region of the first conductive-type semiconductor layer 23. In some implementations, the plurality of mesas M may be placed in island shapes on the upper region of the first conductive-type semiconductor layer 23. Alternatively, the mesas M may extend in one direction to reach an edge of an upper surface of the first conductive-type semiconductor layer 23. For example, edges of lower surfaces of the plurality of mesas M in the one direction may coincide with the edge of the first conductive-type semiconductor layer 23 in the one direction.

Figure 7:
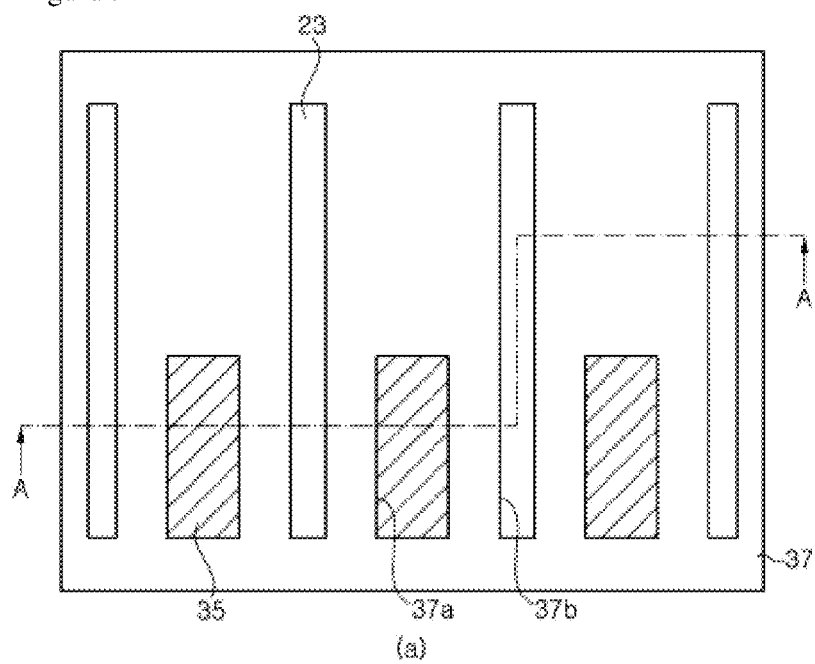
Figure 7:
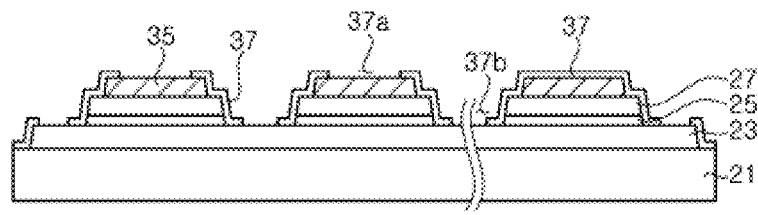

Referring to FIG. 7, a lower insulation layer 37 is formed to cover the plurality of mesas M and the first conductive-type semiconductor layer 23. The lower insulation layer 37 includes openings 37a and 37b to allow electrical connection to the first conductive-type semiconductor layer 23 and the second conductive-type semiconductor layer 27. For example, the lower insulation layer 37 may include openings 37b which expose the first conductive-type semiconductor layer 23 and openings 37a which expose the reflective electrode structures 35.

The openings 37a are placed in upper regions of the mesas M to be biased towards the same end of the mesas. On the other hand, the openings 37b may be placed in a region between the mesas M and near the edge of the substrate 21, and may have an elongated shape extending along the mesa M.

The lower insulation layer 37 may be formed of or include oxides such as $SiO_2$, nitrides such as $SiN_x$, or insulation materials such as $MgF_2$ by chemical vapor deposition (CVD) or the like. The lower insulation layer 37 may be formed to a thickness of, for example, 4000 Å to 12000 Å. The lower insulation layer 37 may be composed of or include a single layer or multiple layers. In addition, the lower insulation layer 37 may be formed as a distributed Bragg reflector (DBR) in which low refractive material layers and high refractive material layers are alternately stacked one above another. For example, an insulation reflective layer having high reflectivity may be formed by stacking, for example, $SiO_2/TiO_2$ layers or $SiO_2/Nb_2O_5$ layers.

Figure 8:
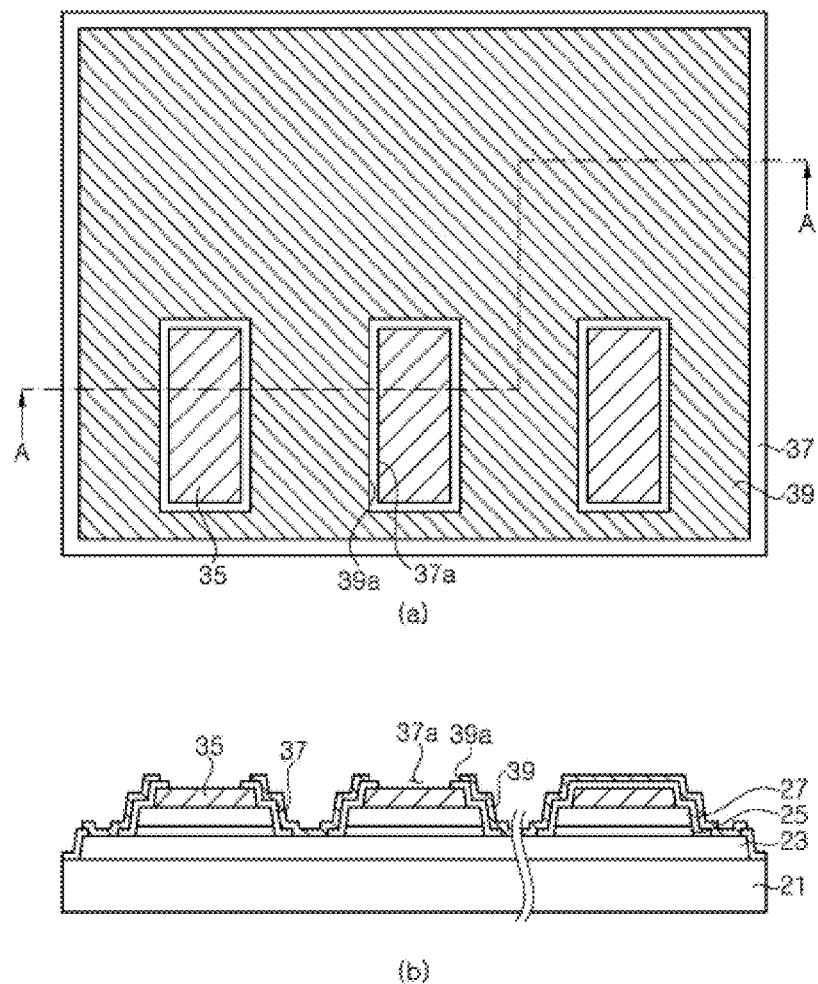

Referring to FIG. 8, a current spreading layer 39 is formed on the lower insulation layer 37. The current spreading layer 39 covers the plurality of mesas M and the first conductive-type semiconductor layer 23. In addition, the current spreading layer 39 includes openings 39a, which are placed in the upper regions of the mesas M and expose the reflective electrode structures 35. The current spreading layer 39 may form ohmic contact with the first conductive-type semiconductor layer 23 through the openings 37b of the lower insulation layer 37. The current spreading layer 39 is insulated from the plurality of mesas M and the reflective electrode structures 35 by the lower insulation layer 37.

Each of the openings 39a of the current spreading layer 39 has a greater area than the openings 37a of the lower insulation layer 37 to prevent the current spreading layer 39 from being connected to the reflective electrode structures 35. Thus, the openings 39a have sidewalls placed on the lower insulation layer 37.

The current spreading layer 39 is formed substantially over the entirety of the upper surface of the substrate excluding the openings 39a. Accordingly, current can easily spread through the current spreading layer 39. The current spreading layer 39 may include a highly reflective metal layer such as an Al layer, and the highly reflective metal layer may be formed on a bonding layer such as a Ti, Cr or Ni layer. In addition, a protective layer having a single layer or composite layer structure of Ni, Cr, or Au, and the like may be formed on the highly reflective metal layer. The current spreading layer 39 may have a multilayer structure of, for example, Cr/Al/Ni/Ti/Ni/Ti/Au/Ti.

Figure 9:
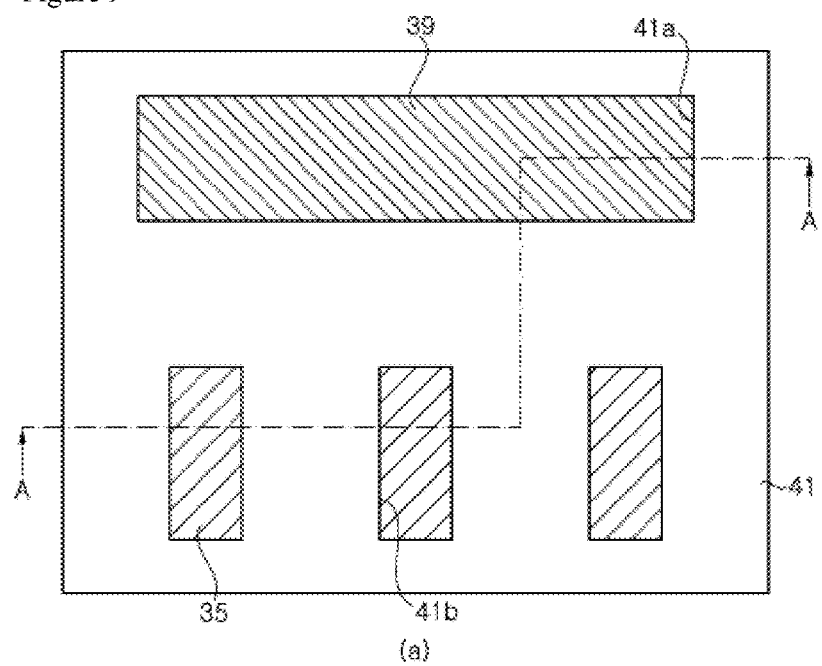
Figure 9:
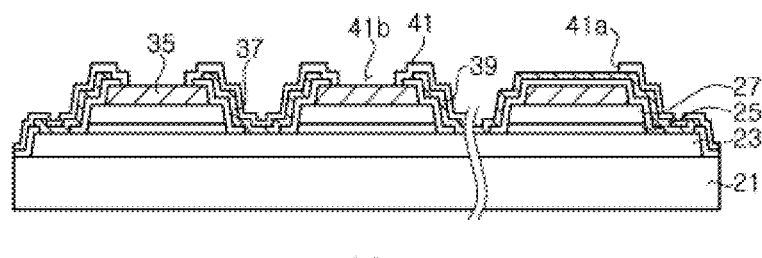

Referring to FIG. 9, an upper insulation layer 41 is formed on the current spreading layer 39. The upper insulation layer 41 includes an opening 41a which exposes the current spreading layer 39, and openings 41b which expose the reflective electrode structures 35. The opening 41a may have an elongated shape in a perpendicular direction with respect to the longitudinal direction of the mesa M, and have a greater area than the openings 41b. The openings 41b expose the reflective electrode structures 35, which are exposed through the openings 39a of the current spreading layer 39 and the openings 37a of the lower insulation layer 37. The openings 41b have a smaller area than the openings 39a of the current spreading layer 39 and a greater area than the openings 37a of the lower insulation layer 37. Accordingly, sidewalls of the openings 39a of the current spreading layer 39 may be covered by the upper insulation layer 41.

The upper insulation layer 41 may be formed of or include silicon nitride to prevent diffusion of metal elements from the solder paste, and may have a thickness of 1 μm to 2 μm. When the upper insulation layer 41 has a thickness of less than 1 μm, it is difficult to prevent diffusion of the metal elements of the solder paste.

Figure 10:
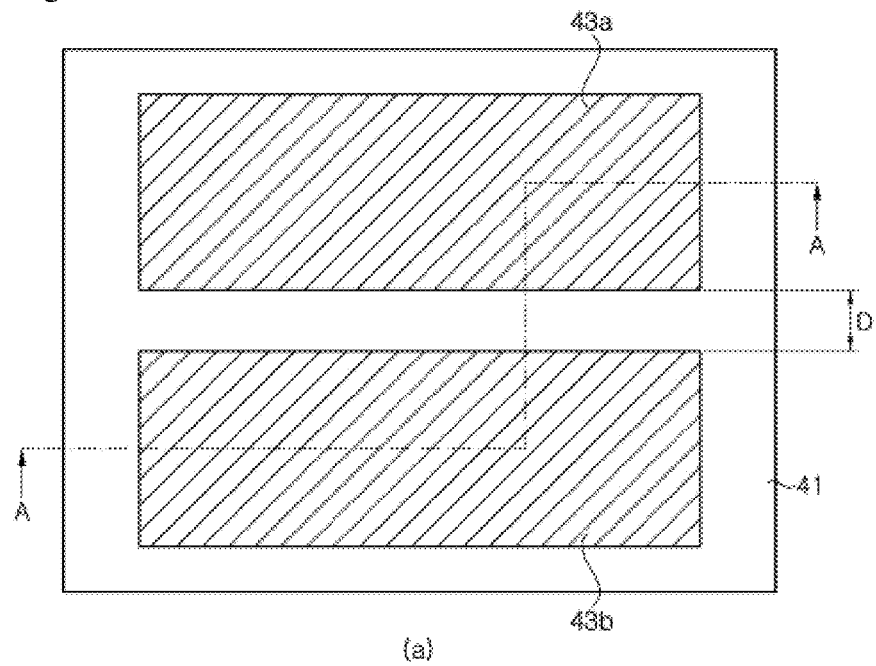

Referring to FIG. 10, a first electrode pad 43a and a second electrode pad 43b are formed on the upper insulation layer 41. The first electrode pad 43a is connected to the current spreading layer 39 through the opening 41a of the upper insulation layer 41 and the second electrode pad 43b is connected to the reflective electrode structures 35 through the openings 41b of the upper insulation layer 41. The first electrode pad 43a and the second electrode pad 43b are used when mounting the light emitting diode on the printed circuit board via the solder pastes. Accordingly, in order to prevent short circuit of the first electrode pad 43a and the second electrode pad 43b by the solder pastes, a distance D between the electrode pads is preferably about 300 μm or more.

The first and second electrode pads 43a and 43b may be formed at the same time by the same process, for example, photolithography and etching technology or lift-off technology. Each of the first and second electrode pads 43a and 43b may include a solder barrier layer and an oxidation barrier layer. The solder barrier layer prevents diffusion of metal elements of the solder paste and the oxidation barrier layer prevents oxidation of the solder barrier layer. The solder barrier layer may include Cr, Ti, Ni, Mo, TiW or W, and the oxidation barrier layer may include Au, Ag or an organic material.

For example, the solder barrier layer may include five pairs of Ti/Ni layers or five pairs of Ti/Cr layers, and the oxidation barrier layer may include Au. With this structure, it is possible to prevent diffusion of metal elements of the solder paste while reducing a total thickness of the first and second electrode pads 43a and 43b to less than 2 μm, or less than 1 μm.

Thereafter, a lower surface of the substrate 21 is partially removed by grinding and/or lapping to reduce the thickness of the substrate 21. Next, the substrate 21 is divided into individual chip units, thereby providing separate light emitting diodes. The substrate 21 may be removed from the LED chips before or after division into the individual LED chip units.

Figure 11:
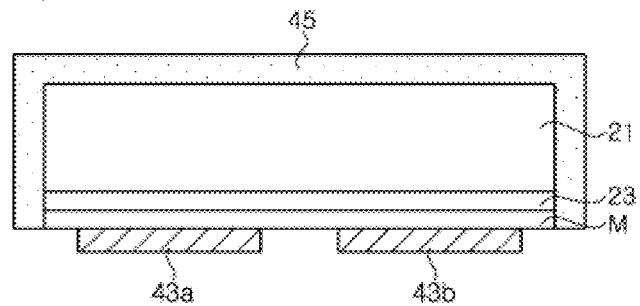

Referring to FIG. 11, a wavelength converter 45 is formed on each of the separate light emitting diodes. The wavelength converter 45 may be formed by coating a phosphor-containing resin onto the light emitting diode using a printing technique, or may be formed by spraying phosphor powder onto the substrate 21 using an aerosol sprayer. For example, aerosol deposition can form a uniform phosphor film on the light emitting diode, thereby improving color uniformity of light emitted from the light emitting diode. Accordingly, after completion of the light emitting diode according to the embodiments of the disclosed technology, the light emitting diode is bonded to the corresponding pads 55 of the printed circuit board 51 via the solder pastes as shown in FIG. 1, thereby providing a final LED module.

Figure 12:
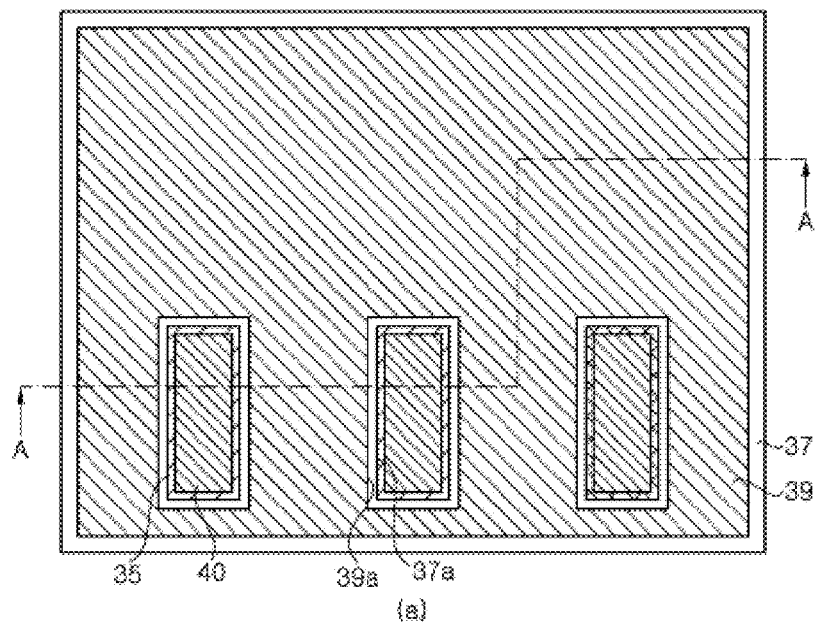
FIG. 12 to FIG. 14 are views illustrating a method of fabricating a light emitting diode according to another embodiment of the disclosed technology, in which (a) is a plan view and (b) is a sectional view taken along line A-A.
Figure 12:
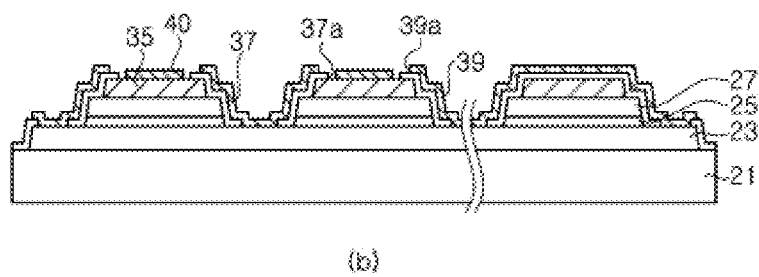
Figure 13:
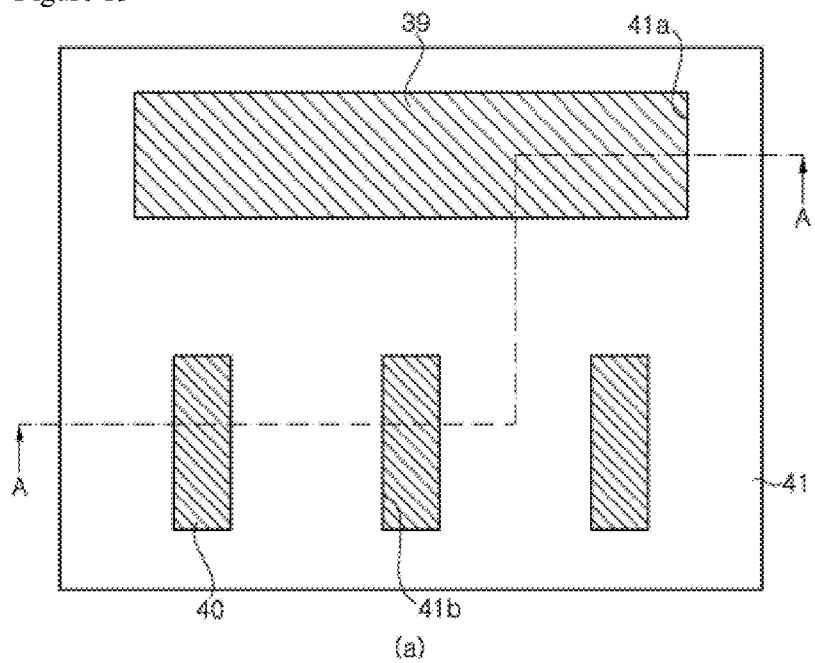
Figure 13:
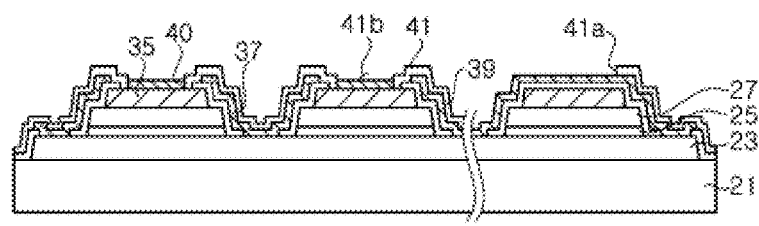
Figure 14:
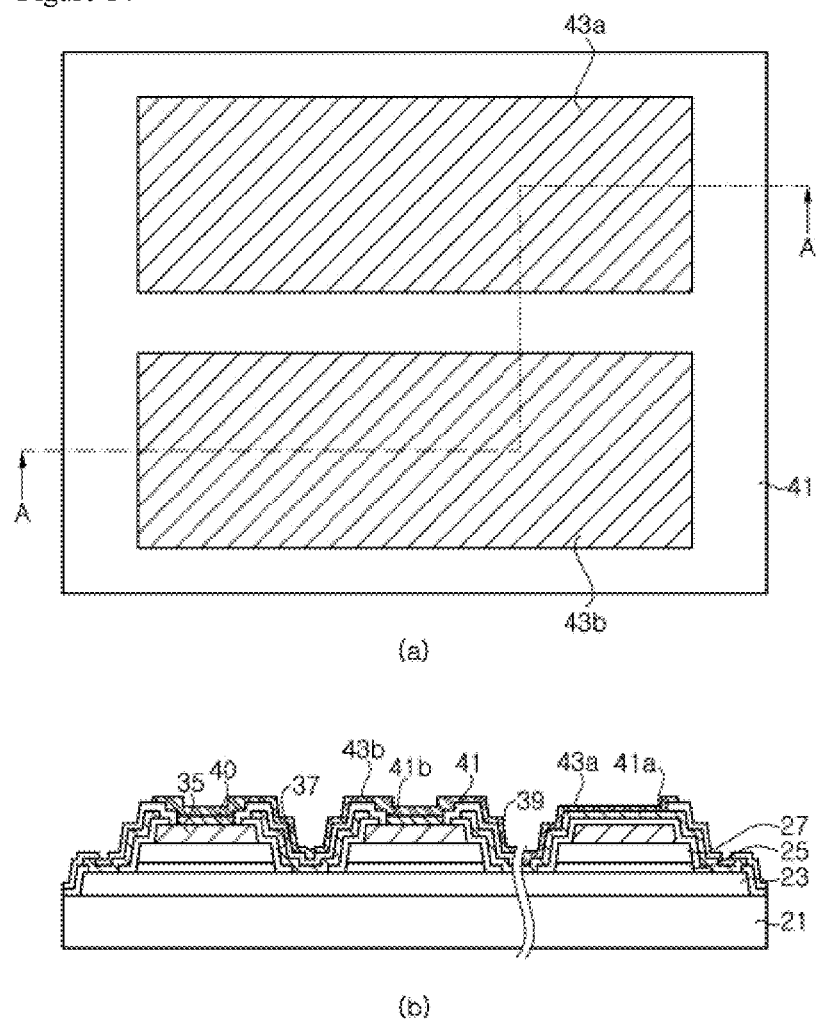

FIG. 12 to FIG. 14 are views illustrating a method of fabricating a light emitting diode according to another embodiment of the disclosed technology, in which (a) is a plan view and (b) is a sectional view taken along line A-A.

Referring to FIG. 12, the LED fabrication method according to this embodiment is generally similar to the LED fabrication method according to the embodiment described with reference to FIG. 2 to FIG. 11 except for formation of an anti-diffusion reinforcing layer 40.

In the LED fabrication method according to this embodiment, a lower insulation layer 37 is formed through the process as described with reference to FIG. 2 to FIG. 7. Then, as described with reference to FIG. 8, a current spreading layer 39 is formed. Here, during formation of the current spreading layer 39, an anti-diffusion reinforcing layer 40 is formed on reflective electrode structures 35. The anti-diffusion reinforcing layer 40 may be formed of or include the same material by the same process as those of the current spreading layer 39 and may be spaced from the current spreading layer 39.

Referring to FIG. 13, an upper insulation layer 41 is formed as described with reference to FIG. 9. Here, openings 41b of the upper insulation layer 41 expose the anti-diffusion reinforcing layer 40.

Referring to FIG. 14, first and second electrode pads 43a and 43b are formed as described with reference to FIG. 10. The second electrode pad 43b is connected to the anti-diffusion reinforcing layer 40. Thus, the anti-diffusion reinforcing layer 40 is placed between the reflective metal structure 35 and the second electrode pad 43b and prevents diffusion of metal elements of the solder paste to the reflective metal structure 35.

Then, the substrate is divided into individual LED chip units and the wavelength converter 45 is formed as described with reference to FIG. 11.

Figure 15:
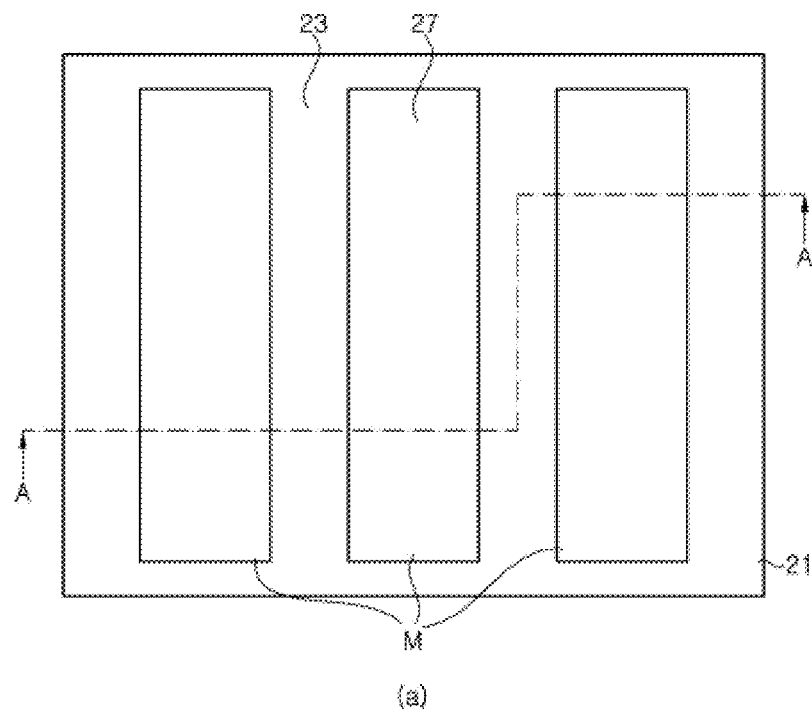
FIG. 15 to FIG. 18 are views illustrating a method of fabricating a light emitting diode according to another embodiment of the disclosed technology, in which (a) is a plan view and (b) is a sectional view taken along line A-A.
Figure 15:
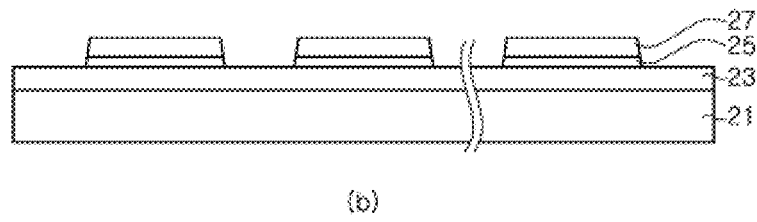
Figure 16:
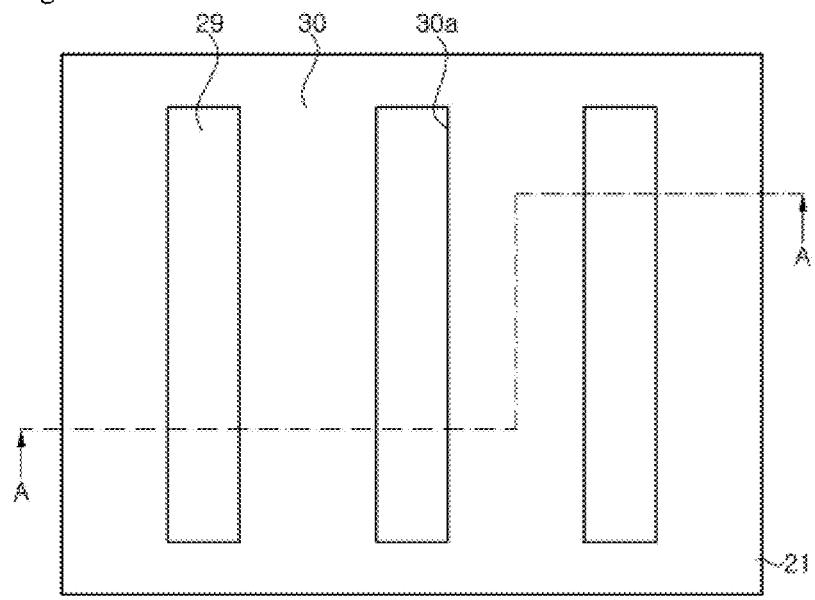
Figure 16:
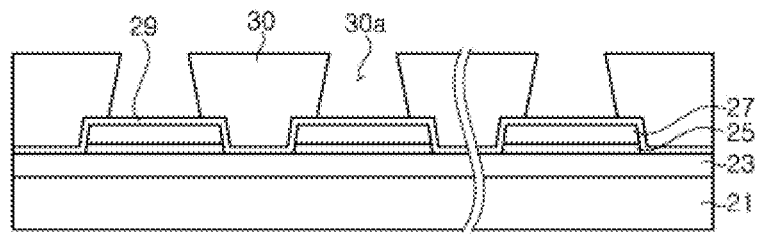
Figure 17:
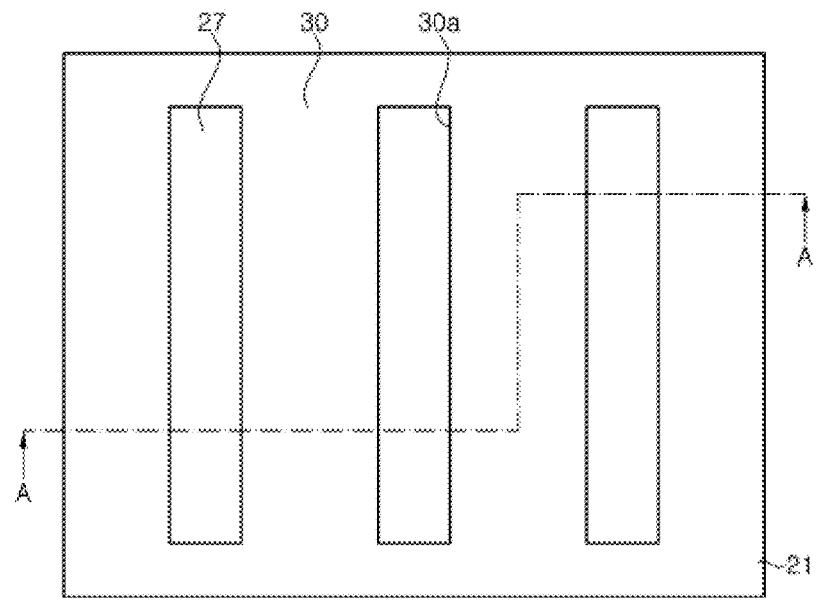
Figure 17:
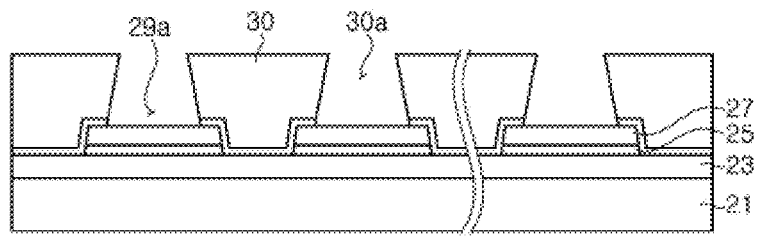

FIG. 15 to FIG. 17 are views illustrating a method of fabricating a light emitting diode according to another embodiment of the disclosed technology, in which (a) is a plan view and (b) is a sectional view taken along line A-A.

In the above embodiments, the mesas M are formed after formation of the reflective electrode structure 35. On the contrary, in this embodiment, the mesas M are formed before formation of the reflective electrode structure 35.

Referring to FIG. 15, a first conductive-type semiconductor layer 23, an active layer 25 and a second conductive-type semiconductor layer 27 are grown on a substrate 21, as described with reference to FIG. 2. Then, a plurality of mesas M is formed through a patterning process. The mesas M are similar to those described with reference to FIG. 5 and thus a detailed description thereof is omitted herein.

Referring to FIG. 16, a preliminary oxidation layer 29 is formed to cover the first conductive-type semiconductor layer 23 and the plurality of mesas M. The preliminary oxidation layer 29 may be formed of or include the same material by the same process as described with reference to FIG. 2. A photoresist pattern 30 having openings 30a is formed on the preliminary oxidation layer 29. The openings 30a of the photoresist pattern 30 are placed within upper regions of the mesas M. The photoresist pattern 30 is the same as the photoresist pattern described with reference to FIG. 1 except that the photoresist pattern 30 is formed on the substrate having the mesas M formed thereon, and thus a detailed description thereof is omitted herein.

Referring to FIG. 17, the preliminary oxidation layer 29 is etched using the photoresist pattern 30 as an etching mask, whereby openings 29a exposing the second conductive-type semiconductor layer 27 are formed.

Figure 18:
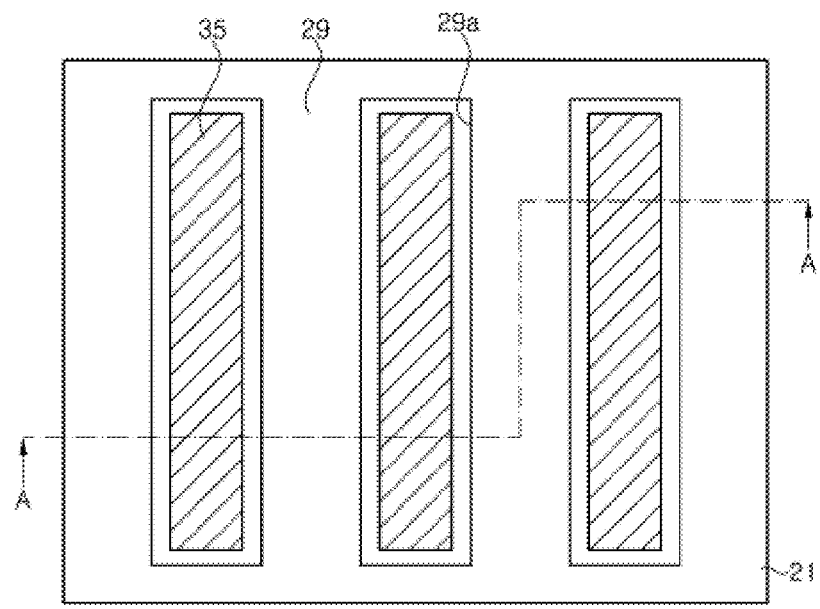
Figure 18:
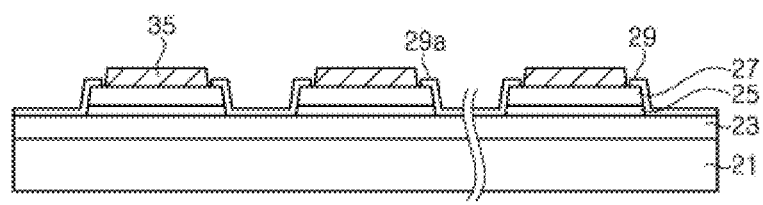

Thereafter, referring to FIG. 18, reflective electrode structures 35 are formed on the mesas M by a lift-off technique, as described in detail with reference to FIG. 4. Then, light emitting diodes can be fabricated through processes similar to those described with reference to FIG. 6 to FIG. 11.

In this embodiment, since the mesas M are formed prior to the reflective electrode structures 35, the preliminary oxidation layer 29 can remain on side surfaces of the mesas M and on a region between the mesas M. Then, the preliminary oxidation layer 29 is covered with the lower insulation layer 39 and is subjected to patterning together with the lower insulation layer 39.

As in this embodiment, the sequence of the processes in fabrication of the light emitting diode can be modified in various ways. For example, a process of isolating LED regions (ISO process) may be performed before formation of the mesas M or before formation of the reflective electrode structures 35.

Figure 19:
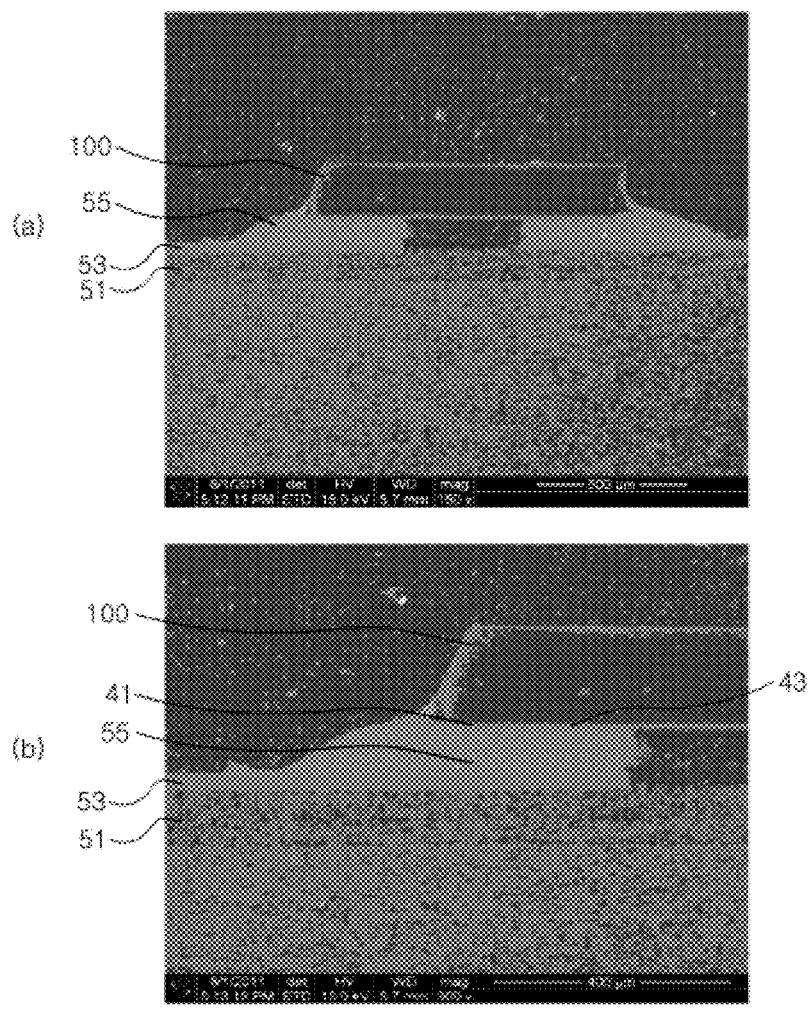
FIG. 19 is a scanning electron microscopy (SEM) sectional view of an LED module fabricated by a method according to one embodiment of the disclosed technology.

FIG. 19 is a scanning electronic microscopy (SEM) sectional view of an LED module fabricated by a method according to one embodiment of the disclosed technology.

Here, (b) shows an SEM sectional view of a solder paste at one side of the SEM section view of (a).

Referring to FIGS. 19 (a) and (b), an light emitting diode 100 is bonded to a printed circuit board 51 having pads 53 via solder pastes 55. The solder pastes 55 bond electrode pads 43 to the pads 53 on the printed circuit board 51. In addition, the solder pastes 55 are placed not only between the electrode pads 43 and the pads 53, but also on part of side surfaces of the electrode pads 43, and also contact the upper insulation layer 41. In addition, as shown in the figure, some of the solder pastes 55 covers a portion of a side surface of the light emitting diode 100.

What is claimed is:

1. A light emitting diode comprising:
   a first conductive-type semiconductor layer;
   a mesa placed on the first conductive-type semiconductor layer, the mesa including an active layer and a second conductive-type semiconductor layer;
   a reflective electrode structure placed on the mess;
   a current spreading layer covering the mesa and the first conductive-type semiconductor layer, and including an opening placed in an upper region of the mesa while exposing the reflective electrode structure, the current spreading layer forming ohmic contact with the first conductive-type semiconductor layer and being insulated from the mesa;
   a lower insulation layer placed between the mesa and the current spreading layer and insulating the current spreading layer from the mesa, the lower insulation layer including an opening placed in the upper region of the mesa and exposing the reflective electrode structure;
   an upper insulation layer covering at least part of the current spreading layer and including an opening on the reflective electrode structure,
   wherein the opening of the upper insulation layer is narrower than the opening of the lower insulation layer.

2. The light emitting diode of claim 1, wherein the upper insulation layer covers a sidewall of the opening of the lower insulation layer.

3. The light emitting diode of claim 1, wherein the opening of the upper insulation layer is narrower than the opening of the current spreading layer.

4. The light emitting diode of claim 3, wherein the upper insulation layer covers a sidewall of the opening of the current spreading layer.

5. The light emitting diode of claim 1, wherein the upper insulation layer covers sidewalls of the openings of the current spreading layer and the lower insulation layer.

6. The light emitting diode of claim 1, wherein the opening of the current spreading layer has a greater width than the opening of the lower insulation layer to expose the opening of the lower insulation layer.

7. The light emitting diode of claim 1, wherein the opening of the upper insulation layer exposes the reflective electrode structure.

8. The light emitting diode of claim 1, further comprising:
   an anti-diffusion reinforcing layer placed on the reflective electrode structure and in the opening of the current spreading layer,
   wherein the opening of the upper insulation layer exposes the anti-diffusion reinforcing layer.

9. The light emitting diode of claim 8, wherein the anti-diffusion reinforcing layer is formed of the same material as that of the current spreading layer.

10. The light emitting diode of claim 8, wherein the opening of the upper insulation layer is limitedly placed on the anti-diffusion reinforcing layer.

11. The light emitting diode of claim 1, wherein the reflective electrode structure comprises a reflective metal section, a capping metal section, and an oxidation prevention metal section,
    the reflective metal section having an inclined side surface such that an upper surface of the reflective metal section has a narrower area than a lower surface thereof,
    the capping metal section covering the upper and side surfaces of the reflective metal section,
    a stress relief layer being formed at an interface between the reflective metal section and the capping metal section.

12. The light emitting diode of claim 1, further comprising: a first electrode pad electrically connected to the first conductive-type semiconductor layer; and
    a second electrode pad electrically connected to the second conductive-type semiconductor layer,
    wherein the first electrode pad and the second electrode pad are disposed on the upper insulation layer, and the second electrode pad is overlapped to the openings of the lower insulation layer, the current spreading layer and the upper insulation layer.

13. The light emitting diode of claim 12, wherein each of the first electrode pad and the second electrode pad comprises a solder barrier layer and an oxidation barrier layer.

14. The light emitting diode of claim 13, wherein the solder barrier layer comprises a metal layer including Cr, Ti, Ni, Mo, TiW or W or a combination of any two of Cr, Ti, Ni, Mo, TiW or W, and the oxidation barrier layer comprises an Au, Ag or organic material layer.

15. The light emitting diode of claim 12, wherein the first electrode pad is connected to the current spreading layer and the second electrode pad is connected to the reflective electrode structure.

16. The light emitting diode of claim 12, further comprising:
    an anti-diffusion reinforcing layer placed on the reflective electrode structure and in the opening of the current spreading layer,
    wherein the first electrode pad is connected to the current spreading layer, and
    the second electrode pad is connected to the anti-diffusion reinforcing layer.

17. The light emitting diode of claim 1, wherein the opening of the current spreading layer is placed to be biased towards an edge of the mesa.

18. The light emitting diode of claim 1, wherein the current spreading layer comprises a reflective metal.

19. The light emitting diode of claim 1, wherein the lower insulation layer comprises a silicon oxide layer and the upper insulation layer comprises a silicon nitride layer.

20. The light emitting diode of claim 1, further comprising:
    a substrate; and
    a wavelength converter covering an upper surface of the substrate.

* * * * *